United States Patent [19]
Forbes

[11] Patent Number: 6,107,893
[45] Date of Patent: Aug. 22, 2000

[54] VOLTAGE TUNABLE ACTIVE INDUCTORLESS OSCILLATOR

[75] Inventor: Leonard Forbes, Corvallis, Oreg.

[73] Assignee: Micron Technology, Inc., Boise, Id.

[21] Appl. No.: 09/204,457

[22] Filed: Dec. 2, 1998

[51] Int. Cl.$^7$ .............................. H03B 5/00; H03B 7/00; H03H 11/00
[52] U.S. Cl. ...................... 331/132; 331/115; 331/181; 333/215
[58] Field of Search ............................ 331/36 L, 108 R, 331/108 L, 115, 117 R, 117 FE, 117 D, 132–134, 181, 177 R; 333/213–217

[56] References Cited

U.S. PATENT DOCUMENTS

| 3,824,496 | 7/1974 | Hekimian | 331/132 |
| 4,760,353 | 7/1988 | Perkins | 331/132 |
| 5,175,513 | 12/1992 | Hara | 331/115 |
| 5,343,170 | 8/1994 | Lee | 331/132 |
| 5,726,613 | 3/1998 | Hayashi et al. | 333/214 |

OTHER PUBLICATIONS

Edited by Razavi, Behzad B., AT&T Laboratories, "Monolithic Phase–Locked Loops and Clock Recovery Circuits," *IEEE Press*, 1996, p. "Reference P2"; Abstract for IEEE Product No. PC5620–QAJ.

Hara, S., and Tokumitsu, T., "Monolithic microwave active inductors and their applications," *IEEE International Symposium on Circuits and Systems*, Singapore, Jun. 11–14, 1991, Abstract No. B9210–1350H–019, (Catalog No. 91CH3006–4), p. 5, vol. xlviii+3177, pp. 1857–1860, vol. 3.

Ali M. Niknejad and Robert G. Meyer, "Analysis, Design, and Optimization of Spiral Inductors and Transformers for Si RF IC's," *IEEE Journal of Solid–State Circuits* 33(10):1470–1481, Oct. 1998.

Lawrence M. Burns, "Applications for GaAs and Silicon Integrated Circuits in Next Generation Wireless Communication Systems," *IEEE Journal of Solid–State Circuits* 30(10):1088–1095, Oct. 1995.

Jürgen Hartung, "Integrated Passive Components in MCM–Si Technology and their Applications in RF–Systems," *1998 International Conference on Multichip Modules and High Density Packaging*, pp. 256–261.

(List continued on next page.)

*Primary Examiner*—David Mis
*Attorney, Agent, or Firm*—Dorsey & Whitney LLP

[57] ABSTRACT

An inductorless voltage controlled oscillator that may be fabricated using CMOS circuit elements. In one aspect, the present invention includes a synthetic inductance formed on a substrate and having first and second power supply terminals and a signal port. Additionally, an active admittance transformation network is formed on the substrate and coupled to the synthetic inductance and to the port. The synthetic inductance manifests an admittance at the port which has an inductive component and a positive real component. The active admittance transformation network transforms the positive real component of the synthetic inductance admittance to a negative real component and preserves the inductive character of the synthetic inductance admittance. The synthetic inductance can provide an effective Q of greater than twenty. The active admittance transformation network and the synthetic inductance cooperate to produce a voltage-variable oscillation frequency in excess of fifty megahertz. Voltage dependent values for parasitic impedances and admittances of the first and second amplifiers cause an oscillation frequency $\omega_{OSC}$ to be swept over a range of tens or hundreds of megahertz by altering a supply voltage. Significantly, the voltage controlled oscillator may be formed as a monolithic CMOS or a BiCMOS integrated circuit. As a result, the voltage controlled oscillator may be cost-effectively combined with other kinds of circuits, such as signal processors and digital circuits.

31 Claims, 4 Drawing Sheets

OTHER PUBLICATIONS

Hitoshi Hayashi and Masahiro Muraguchi, "A Novel Broad–Band MMIC VCO Using an Active Inductor," *IEICE Trans. Fundamentals E81–A*(2):224–229, Feb. 1998.

Donald A. Hitko et al., "A 1V 5mW, 1.8GHz, Balanced Voltage–Controlled Oscillator with an Integrated Resonator," *Proceedings 1997 International Symposium on Low Power Electronics and Design*, ACM, New York, NY, Aug. 18–20, 1997, pp. 46–51.

Jan Craninckx and Michiel Steyaert, "A 1.8–GHz Low–Phase–Noise Spiral–LC CMOS VCO," *1996 Symposium on VLSI Circuits Digest of Technical Papers*, pp. 30–31.

Behzad Razavi, "A Study of Phase Noise in CMOS Oscillators," *IEEE Journal of Solid–State Circuits 31*(3):331–343, Mar. 1996.

VOLTAGE TUNABLE ACTIVE INDUCTORLESS OSCILLATOR

TECHNICAL FIELD

The present invention relates in general to monolithic radio frequency circuits and in particular to improved monolithic voltage tunable oscillators.

BACKGROUND OF THE INVENTION

Wireless communications products have become high volume consumer electronics accessories and are in increasing demand for a broad variety of applications. Features that are increasingly emphasized include reduced power consumption, small form factor, light weight and portability. Many of these products operate in a frequency range extending from about one hundred megahertz to about two gigahertz. As a result, there is a demand to integrate RF receivers and transmitters into high-yield silicon integrated circuit processes to allow a combination of analog, digital and RF functions on a single integrated circuit. "Applications for GaAs and Silicon Integrated Circuits in Next Generation Wireless Communication Systems," by L. M. Burns, IEEE JSSC, Vol. 30, No. 10, October 1995, pp. 1088–1095, discusses examples of monolithic radio receiver and transmitter functions.

Most radio receivers and transmitters require frequency selection components that rely on some form of oscillation to provide frequency selectivity. Devices such as crystals and SAWs that employ mechanical vibration to realize frequency selection also require hermetic packages having interior cavities in order to provide reliable and robust electrical characteristics, particularly in view of environmental insults. Often, the package is more expensive than the component within it. Additionally, multiple packages are required, because the materials useful for these types of frequency selection components do not support active electronic devices, and vice versa. Further, devices that rely on mechanical oscillation also use materials having different packaging requirements than do active electronic devices.

Electronic circuits that do not rely on mechanical vibrations for frequency selection characteristics often rely instead on electrical resonances to provide frequency selectivity. Practical electrical resonators in this frequency range require a combination of capacitance and inductance. Of these, inductance is particularly difficult to realize in compact form together with reasonably high quality factor, or "Q." Q is often defined as the amount of energy stored divided by the amount of energy dissipated per cycle, but can also be defined as a center frequency divided by a three dB bandwidth of a frequency response. The latter definition is used herein in instances where the former is inapplicable.

Known approaches for realizing monolithic inductance include spiral inductors, transmission lines and bond wires. For example, "A 1.8 GHz Low-Phase-Noise Spiral-LC CMOS VCO," by J. Cranickx and M. Steyaert, 1996 Symp. on VLSI Cir. Dig. Tech. Papers, pp. 30–31 describes a spiral inductor approach that achieves a Q of 5.7 near two gigahertz. "Integrated Passive Components in MCM-Si Technology and their Applications in RF-Systems," by J. Hartung, 1998 Int. Conf. on Multichip Modules and High Density Packaging, IEEE Cat. No. 0-7803-4850-8/98, pp. 256–261, reports Qs and their frequency dependence for spiral inductors vs. substrate resistance, with highest Qs and self-resonant frequencies for spiral inductors fabricated on higher-resistivity substrates. A recent overview of spiral inductive components, entitled "Analysis, Design, and Optimization of Spiral Inductors and Transformers for Si RF IC's," by A. Niknejad and R. Meyer, IEEE JSSC, Vol. 33, No. 10, October 1998, pp. 1470–1481, gives examples of Qs having peak values around five and inductances of up to about ten nanoHenrys for spiral inductors fabricated on silicon.

Transmission line approaches to realizing monolithic inductance tend to be bulky and relatively lossy in this frequency range. Bond wires can provide Qs ranging from 11 to 15, as described in "A 1V, 1.8 GHz, Balanced Voltage-Controlled Oscillator with an Integrated Resonator," by D. A. Hitko et al., Proc. Symp. Low Power Electr. and Des., pp. 46–51 (1997). Bond wire inductors tend to be relatively large compared to other integrated circuit components, but do permit the surface area beneath them to be used to fabricate other integrated circuit elements prior to bond wire installation. Bond wire inductors also require bond pads, which are relatively large, and which preclude use of their area for other purposes. None of these approaches provide the combination of small form factor, high Q and packageability needed for many applications.

Another approach to providing a frequency selection function in monolithic form relies on impedance transformations that are possible with active circuits, i.e., circuits including transistors. U.S. Pat. No. 5,175,513, entitled "Oscillator Circuit Employing Inductive Circuit Formed of Field Effect Transistors" and issued to S. Hara describes an example using MESFETs. U.S. Pat. No. 5,726,613, entitled "Active Inductor" and issued to H. Hayashi et al. and "A Novel Broad-Band MMIC VCO Using an Active Inductor," by H. Hayashi and M. Maraguchi, IEICE Trans. Fundamentals, Vol. E81-A, No. 2, February 1998, pp. 224–229, describe similar approaches. While these approaches do provide compact circuits, they use GaAs MESFETs, which are not as manufacturable as CMOS FETs and which are not cost-competitive with silicon integrated circuits. Additionally, it is much more expensive to provide complex ancillary functions on GaAs substrates, such as may be realized using digital circuitry, than is the case with silicon substrates.

Some oscillators do not require either inductance to form an electrical resonance or mechanical oscillations to achieve frequency selectivity or control. "A Study of Phase Noise in CMOS Oscillators" by B. Razavi, IEEE JSSC, Vol. 31, No. 3, March 1996, pp. 331–343, compares several different types of CMOS-compatible oscillators. A first type is a ring oscillator employing a number of inverter stages coupled in a ring configuration. Ring oscillators are used in some systems, however, ring oscillators have limited voltage tuning capability, require a relatively large number of FETs and do not provide a sinusoidal output signal. A second type of oscillator that is discussed is a relaxation oscillator. The relaxation oscillator is simpler than the ring oscillator and requires less area to implement in an integrated circuit, but also has limited tunability.

Therefore, there is a need for monolithic circuitry that provides voltage-controlled oscillators and that is compatible with cost-effective approaches to providing other circuit functions.

SUMMARY OF THE INVENTION

In one aspect, the present invention includes a synthetic inductance formed on a substrate and having first and second power supply terminals and a signal port. Additionally, an active admittance transformation network is formed on the substrate and coupled to the synthetic inductance and the port. The synthetic inductance manifests an admittance at the port which has an inductive component and a positive real component. The active admittance transformation network transforms the positive real component of the synthetic inductance admittance to a negative real component and preserves the inductive character of the synthetic inductance admittance. As a result, the active admittance transformation network and the synthetic inductance cooperate to produce a voltage-variable oscillation frequency in excess of fifty megahertz.

In one aspect of the invention, the synthetic inductance presents a frequency-dependent admittance at the port and includes a first amplifier configured to provide nearly unity gain, a high input impedance and a low output impedance. The first amplifier has a first output coupled to the port and a first input. A first phase shifter is coupled between the port and a reference voltage. A second amplifier is configured to provide greater than unity voltage gain, has a second input coupled to the first output and has a second output coupled to the first input. A second phase shifter is coupled between the second output and a reference voltage. The synthetic inductance is capable of providing an effective Q of greater than twenty. Voltage dependent values for parasitic impedances and admittances of the first and second amplifiers cause an oscillation frequency $\omega_{OSC}$ to vary over a range of tens or hundreds of megahertz by altering the supply voltage.

Significantly, the voltage controlled oscillator may be formed as a monolithic CMOS or BiCMOS integrated circuit. As a result, the voltage controlled oscillator may be cost-effectively combined with other kinds of circuits, such as amplifiers, mixers, signal processors, audio and digital circuits.

DETAILED DESCRIPTION OF THE INVENTION

Figure 1:
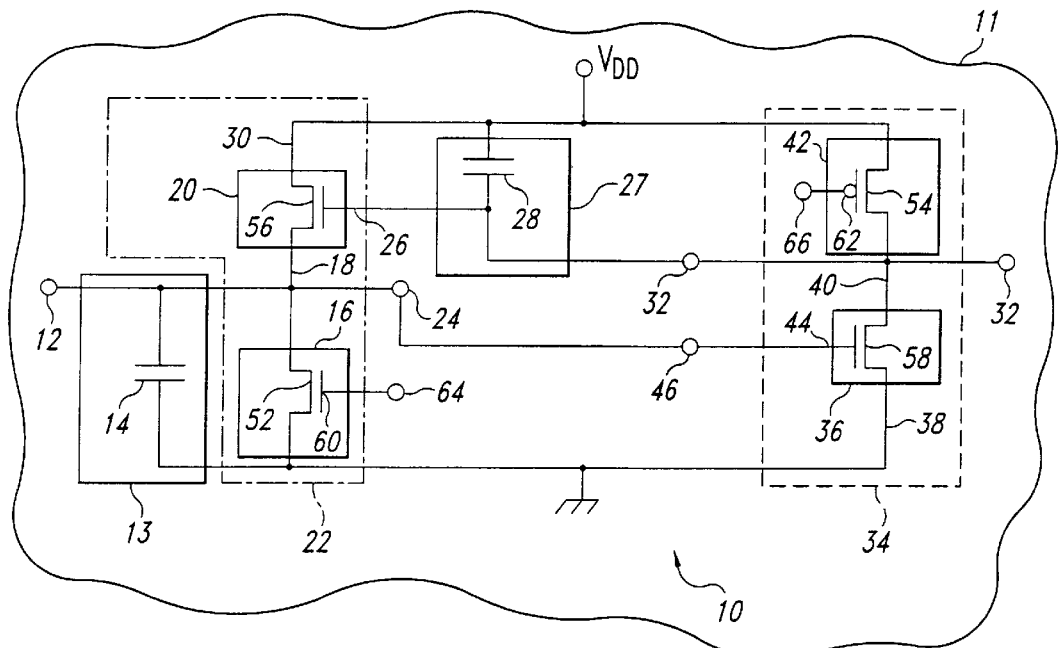
FIG. 1 is a simplified schematic diagram of an inductorless, voltage-tunable filter circuit providing a synthetic inductance, in accordance with an embodiment of the present invention.

FIG. 1 is a simplified schematic diagram of an inductorless, voltage-tunable filter circuit 10 formed on a substrate 11 that provides a synthetic inductance, in accordance with an embodiment of the present invention. The filter circuit 10 includes a signal port 12 coupled to a first phase shift network 13. In one embodiment, the first phase shift network 13 is formed from a first capacitor 14 having a first capacitance $C_1$ coupled in shunt with the port 12. The filter circuit 10 also includes a first current source 16 and a first current-carrying or power electrode 18 of a first transistor 20 forming a first amplifier 22. The first amplifier 22 provides a voltage gain at an amplifier output 24 of nearly unity, together with high input impedance and relatively low output impedance. The output 24 of the first amplifier 22 is also coupled to the port 12 to the filter circuit 10.

The first transistor 20 has a control electrode 26 coupled to a second phase shift network 27. In one embodiment, the second phase shift network 27 is formed from a second capacitor 28 having a second capacitance $C_2$. The first transistor 20 has a second current-carrying or power electrode 30 coupled to a voltage source $V_{DD}$. The control electrode 26 is coupled to an output 32 of a second amplifier 34. The second amplifier 34 is formed from a second transistor 36 having a first power electrode 38 that is grounded and a second power electrode 40 coupled through a second current source 42 to the voltage source $V_{DD}$. The second transistor 36 has a control electrode 44 forming an input 46 to the second amplifier 34. The control electrode 44 is also coupled to the output 24 of the first amplifier 22.

In one embodiment, the first and second capacitors 14 and 28 are thin-film capacitors. In another embodiment, the first and second capacitors 14 and 28 are MOS capacitors, i.e., with one plate of the capacitor 14 or 28 formed as a metallic or polysilicon contact on a dielectric, such as a gate oxide, and the other plate of the capacitor 14 or 18 formed as an inversion layer of minority charge carriers in semiconducting material on another side of the dielectric. In one embodiment, the filter circuit 10 uses FETs 52 and 54 to realize the first and second current sources 16 and 42. In one embodiment, the first transistor 20 is a FET 56 configured as a source follower amplifier. In one embodiment, the second transistor 36 is a FET 58 configured as a common source amplifier 34. In one embodiment, the first transistor 20 is a bipolar transistor configured as an emitter follower amplifier 22. In one embodiment, the second transistor 36 is a bipolar transistor configured as a common emitter amplifier.

For the filter circuit 10 where the first 20 and second 36 transistors of FIG. 1 are FETs 56, 58 having transconductances $gm_1$ and $gm_2$, respectively, to first order, the filter circuit 10 has a center frequency $\omega_o$:

$$w_o = ((gm_1 \cdot gm_2)/(C_1 \cdot C_2))^{0.5}, \quad \text{(Eq. 1)}$$

and a quality factor Q:

$$Q = ((C_1 \cdot gm_2)/(C_2 \cdot gm_1))^{0.5}, \quad \text{(Eq. 2)}$$

when parasitic conductances and capacitances associated with the first 56 and second 58 FETs are ignored (i.e., $G_{DS}$, $C_{GS}$ etc.). The ratio of the center frequency $\omega_o$ to the Q gives the bandwidth B of the circuit as:

$$B = \omega_o/Q = gm_1/C_2, \quad \text{(Eq. 3)}$$

In one embodiment, the transconductance $gm_1$ of the FET 56 is $5.2 \times 10^{-5}$ Siemens, corresponding to a channel width of 1 micron, and the transconductance $gm_2$ of the FET 58 is $5 \times 10^{-3}$ Siemens, corresponding to a channel width of 100 microns. When these parameters are coupled with values of $C_1 = 1$ picoFarad for the first capacitor 14 and $C_2 = 30$ femto-Farads for the second capacitor 28, simulations show that a center frequency $\omega_o$ of 468 megahertz is realized together with a Q of 57, corresponding to a bandwidth B of about 10 megahertz. In many situations, a Q of greater than ten is desirable and a Q of greater than 20 or 25 may be extremely desirable. In general, achieving Qs in this range requires that the transconductance $gm_1$ of the FET 56 be less than one-tenth of the transconductance $gm_2$ of the FET 58 and preferably substantially less than one-tenth of the transconductance $gm_2$.

In one embodiment, the FET 52 is an NMOS FET having the same channel width as an NMOS FET forming the FET 56, while the FET 54 is a PMOS FET having the same channel width as an NMOS FET forming the FET 58, where for simplicity it is assumed the NMOS and PMOS transistors have the same characteristics. In some embodiments, the FETs 52 and 54 have their gates 60 and 62 coupled to bias voltages at nodes 64 and 66, respectively. The bias voltages at nodes 64 and 66 may be provided by any conventional voltage source. Current sources 16 and 38 are preferred to supply current to the transistors 20 and 36, rather than, for example, resistors, because a higher effective RF impedance is provided together with a relatively low supply voltage.

Figure 2:
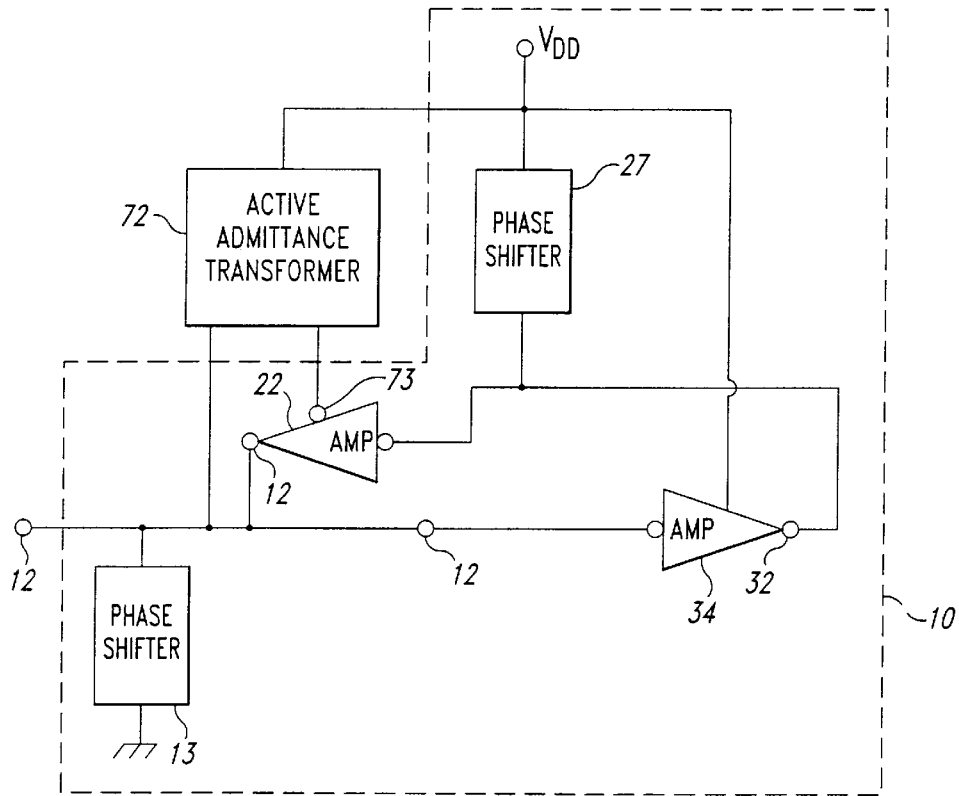
FIG. 2 is a simplified block diagram of a voltage controlled oscillator circuit including the synthetic inductance of FIG. 1, in accordance with an embodiment of the present invention.

FIG. 2 is a simplified block diagram of an oscillator circuit 70 formed from the filter circuit 10 of FIG. 1, in accordance with an embodiment of the present invention. Many of the components used in the embodiment of the oscillator circuit 70 of FIG. 2 are identical to components used in the embodiment of the circuit 10 of FIG. 1. Therefore, in the interest of brevity, these components have been provided with the same reference numerals, and an explanation of them will not be repeated.

The port 12 to the voltage-tunable filter circuit 10 of FIG. 1 can be modeled as a parallel RLC tank circuit at resonance. The effective inductance L is:

$$L = C_2/(gm_1 \cdot gm_2). \qquad \text{(Eq. 4)}$$

The circuit 10 thus is capable of synthesizing an admittance at the port 12 that acts as an inductor but the circuit 10 is formed only from resistors, capacitors, transistors and interconnections. The term "synthetic inductance" is defined herein to mean a circuit such as the circuit 10 that includes no inductors but that is able to provide a high Q inductive admittance at the port 12. However, the admittance observed at the port 12 has a positive real part and therefore the circuit 10 of FIG. 1 will not oscillate. Adding an active admittance transformation network 72 that is coupled between a power supply node 73 of the amplifier 22 and $V_{DD}$ and that is also coupled to the port 12 can provide a negative real portion to the admittance of the port 12 while preserving the inductive character of the admittance at the port 12. The circuit 70 will then oscillate, and the port 32 of the filter circuit 10 of FIG. 1 becomes an output 32 of the oscillator circuit 70 of FIG. 2.

Figure 3:
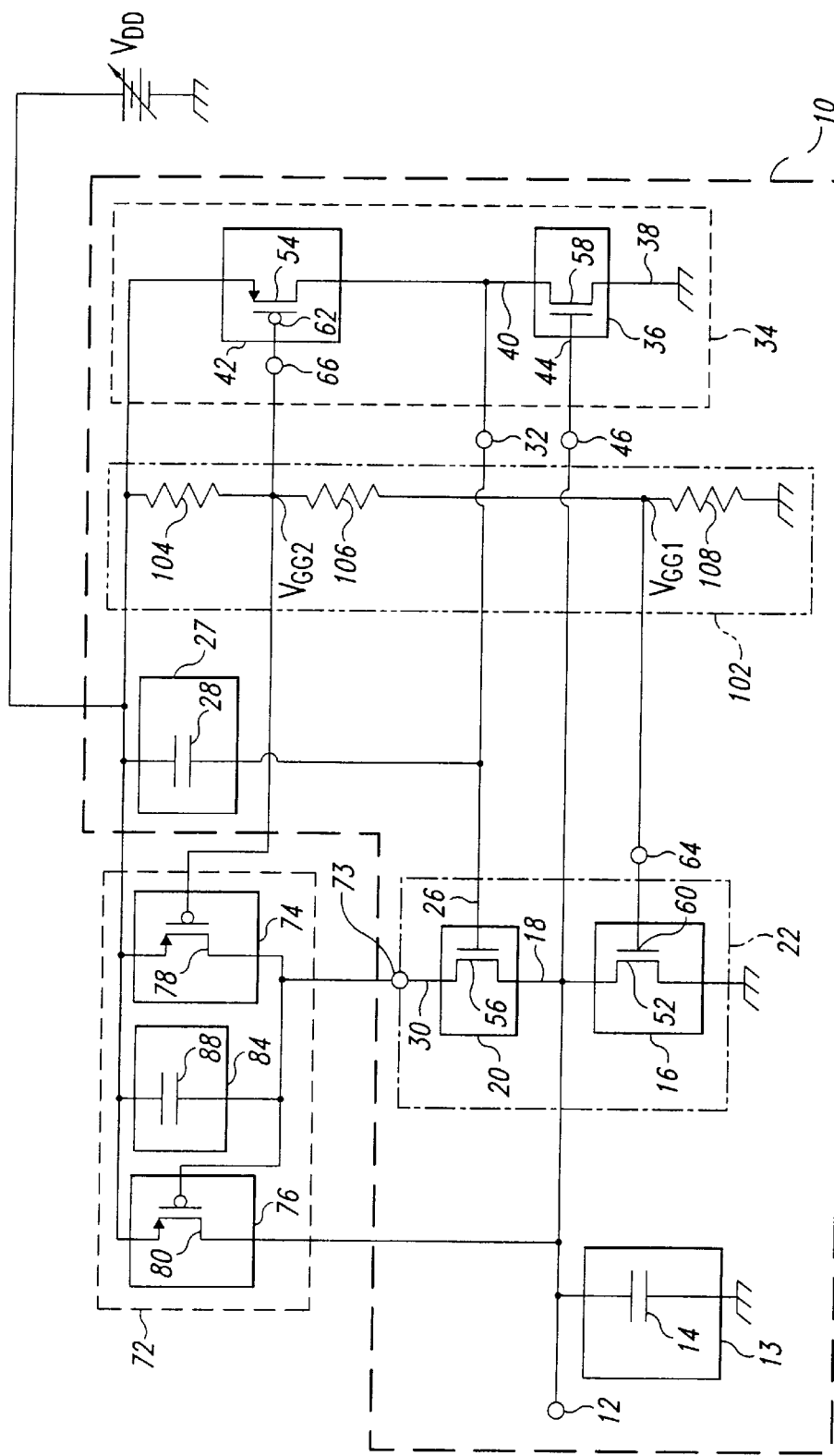
FIG. 3 is a simplified schematic diagram of an oscillator circuit that is an embodiment of the voltage-controlled oscillator circuit of FIG. 2, in accordance with an embodiment of the present invention.

FIG. 3 is a simplified schematic diagram of an embodiment of a voltage-controlled oscillator circuit 100 in accordance with the embodiment of the voltage-controlled oscillator circuit of 70 FIG. 2. The active admittance transformation network 72 includes a current source 74 that provides the transistor 20 with a suitable current. The active admittance transformation network 72 also includes a transistor 76 having a control electrode coupled to the second power electrode 30 of the transistor 20, a first power electrode coupled to $V_{DD}$ and a second power electrode coupled to the port 12. The current source 16 provides a suitable current to the transistor 76.

In one embodiment, the transistors 74 and 76 are PMOS FETs 78 and 80, respectively. For simplicity it is assumed the NMOS and PMOS transistors have the same characteristics. In this embodiment, the current source 16 may be the FET 52, but with the channel width altered to be the sum of the channel widths of the FETs 78 and 56 forming the transistors 20 and 76, respectively. In this embodiment, channel widths for the FETs 78 and 56 are chosen to be identical. As a result, the FET 78 limits current through the FET 56, and the FETs 78 and 52 cooperate to determine the current through the FET 80.

The active admittance transformation network 72 also includes a phase shift element 84. In one embodiment, the phase shift element 84 is formed as a capacitor 88. When the transconductance $gm_3$ for the transistor 76 is large, and the capacitance of the capacitor 88 is small, the admittance at the output 12 can have a negative real part. The circuit 100 then can oscillate at an oscillation frequency $\omega_{OSC}$.

In one embodiment, the oscillator circuit 100 employs a resistive divider network 102 to provide multiple gate bias voltages $V_{GG1}$ and $V_{GG2}$ that maintain a fixed ratio as the power supply voltage $V_{DD}$ is varied to tune the oscillation frequency $\omega_{OSC}$. The resistive divider network 102 includes a first resistor 104 having a first terminal coupled to a variable supply voltage $V_{DD}$ and a second terminal coupled to the gate 62 of the FET 54 forming the second current source 42 and also to the gate of the FET 78. A second resistor 106 has a first terminal coupled to the second terminal of the first resistor 104 and a second terminal coupled to the gate 60 of the FET 52 forming the first current source 16. A third resistor 108 has a first electrode coupled to the second electrode of the second resistor 106 and a second electrode coupled to ground. As a result, the ratio of the gate bias voltage $V_{GG1}$ on the FET 52 to the gate bias voltage $V_{GG2}$ on the FETs 54 and 78 is constant with changing $V_{DD}$. In turn, the currents through the other transistors 20, 36 and 76 vary together as $V_{DD}$ changes.

In some embodiments, a conventional digital-to-analog converter (not illustrated) may be employed to supply the variable supply voltage $V_{DD}$ under control of a conventional processor (not illustrated). This allows the frequency of oscillation $\omega_{OSC}$ to be set in response to external commands or in response to variables sensed within the system containing the oscillator 70 or 100 of FIGS. 2 or 3, respectively.

As a result, a simple circuit 100 is realized that provides an oscillation frequency $\omega_{OSC}$ that may be varied over a relatively broad frequency range in response to a simple voltage change. Significantly, the circuits 10, 70 and 100 of FIGS. 1, 2 and 3, respectively, lend themselves to monolithic fabrication, and, in some embodiments, fabrication using MOS processes such as CMOS and BiCMOS, allowing them to be formed on an integrated circuit that is also capable of supporting digital logic and other functions.

Figure 4:
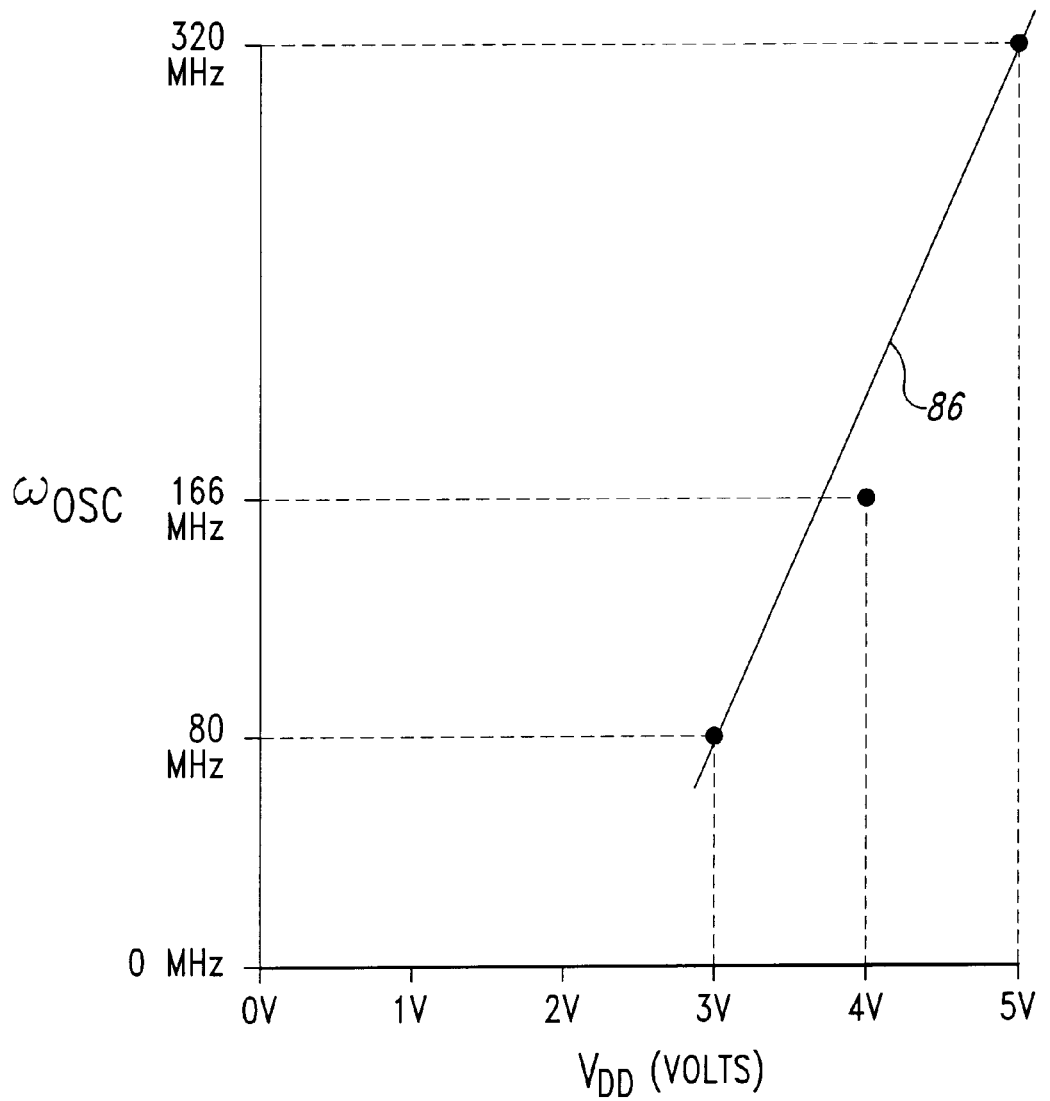
FIG. 4 is a graph showing simulated oscillation frequency $\omega_{OSC}$ versus power supply voltage for the circuit of FIG. 3, in accordance with an embodiment of the present invention.

FIG. 4 is a graph showing a trace 86 representing oscillation frequency $\omega_{OSC}$ versus power supply voltage for the oscillator circuit 100 of FIG. 3, in accordance with an embodiment of the present invention.

The trace 86 of FIG. 4 shows a roughly linear dependence of the oscillation frequency $\omega_{OSC}$ on supply voltage $V_{DD}$, with an average sweep rate of about 80 megahertz per volt, and also shows a broad range of frequencies over which the oscillator circuits 70 and 100 of FIGS. 2 and 3, respectively, may be tuned. It will be appreciated that other frequency ranges may be realized by altering values for components in the oscillator circuit 100 of FIG. 3.

Figure 5:
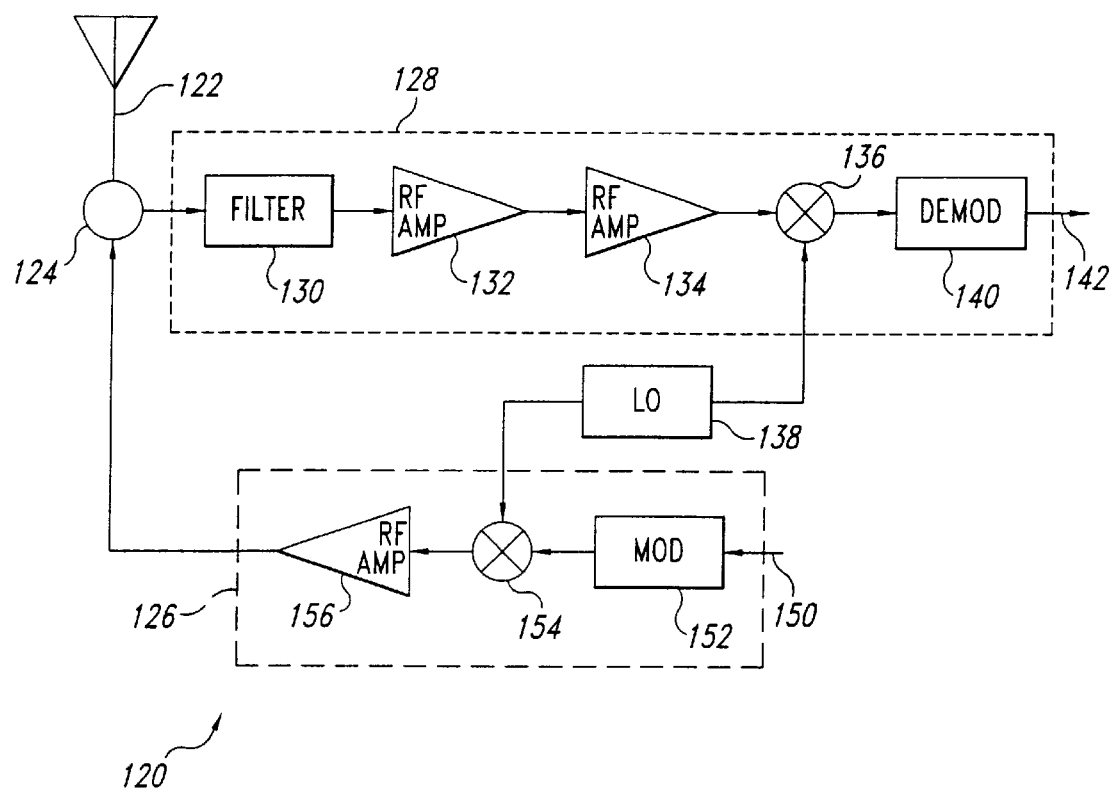
FIG. 5 is a simplified block diagram of a radio including a voltage controlled oscillator using the oscillators of FIGS. 2 or 3, in accordance with an embodiment of the present invention.

FIG. 5 is a simplified block diagram of a radio 120 using the voltage controlled oscillator circuits 70 or 100 of FIGS. 2 or 3, respectively, in accordance with an embodiment of the present invention. The radio 120 includes an antenna 122 for transmitting and receiving signals. The antenna 122 is coupled to an optional T/R switch or duplexer 124 that may be needed to separate signals originating in an optional transmitter section 126 from signals intended for a receiver section 128. The receiver section 128 may include an optional filter 130 that accepts RF input signals from the antenna 122 and typically includes one or more radio frequency amplifiers 132, 134 (marked "RF AMP" in FIG. 5) coupled in series. A mixer 136 mixes signals from the amplifiers RF AMP 132, 134 with signals from a local oscillator LO 138 to provide baseband or IF signals that are then processed and demodulated by a signal processor DEMOD 140 to provide an output signal at an output 142. The output signal may be an IF signal, a visual or audible annunciation, for example when the receiver section 128 forms a portion of a paging device or portable telephone, or may be digital data or voice signals in other applications.

In those applications where the transmitter section 126 is also a portion of the radio 120, input data coupled to an input 150 is processed in a signal processor MOD 152 that typically includes a modulator and that may include other functions. An output signal from the processor 152 is mixed with a signal from the local oscillator LO 138 in a mixer 154 to provide radio frequency signals. The radio frequency signals are typically amplified in a radio frequency amplifier RF AMP 156 and are routed to the antenna 122 for transmission.

In the radio 120, the optional filter 130 may be a conventional passive filter or as the circuit 10 of FIG. 1. In some applications, a passive filter offers intermodulation advantages, while in others, noise figure is a dominating concern, requiring a low noise gain block coupled to the antenna 122. The radio frequency amplifiers RF AMP 132, 134, 156 may be conventional RF amplifiers.

An advantage to radios 120 using the voltage controlled oscillator circuits 70 or 100 of FIGS. 2 and 3 to provide the local oscillator LO 138 is that many, if not all, of the functions of the radio 120 may then be formed on a single integrated circuit. As a result, the radio 120 may be manufactured using less labor together with improved footprint, reduced weight, greater reliability and reduced power consumption, and in a very compact package. The radio 120 may also be combined with other functional blocks in a single integrated circuit.

Another application for voltage controlled oscillators such as the oscillators 70 or 100 of FIGS. 2 and 3, respectively, is to provide clock signals in distributed computer networks. Other applications include phase locked loops for clock synchronization in digital CMOS circuits.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A monolithic voltage controlled oscillator comprising:
an integrated circuit substrate including silicon;
a synthetic inductance formed on the substrate and having first and second power supply terminals and a port presenting a frequency-dependent admittance having an inductive component and a positive real component, the synthetic inductance including an amplifier configured to provide nearly unity gain, a high input impedance and a low output impedance, the amplifier having an output coupled to the port and an input; and
an active admittance transformation network formed on the substrate and coupled to the synthetic inductance and the port, the active admittance transforming network transforming the positive real component to a negative real component, the active admittance transforming network and the synthetic inductance cooperating to produce an oscillator, the active admittance transformation network comprising:
a transistor having a control electrode coupled to a power supply node of the amplifier, a first power electrode coupled to a power supply and a second power electrode coupled to the input; and
a phase shift network coupled between the gate and the power supply.

2. The oscillator of claim 1 wherein the synthetic inductance and the active admittance transformation network consist essentially of resistors, capacitors, transistors and interconnections.

3. The oscillator of claim 1 wherein the synthetic inductance and the active admittance transformation network are formed using a CMOS process.

4. The oscillator of claim 1 wherein the synthetic inductance and the active admittance transformation network are formed using a BiCMOS process.

5. The oscillator of claim 1, wherein an oscillation frequency of the oscillator varies with supply voltage.

6. The oscillator of claim 1, wherein the synthetic inductance provides an effective Q of greater than twenty.

7. The oscillator of claim 1, wherein the transistor is an NMOS FET, and the control electrode, first power electrode and the second power electrode correspond to a gate, source and drain, respectively, of the MOS FET.

8. The oscillator of claim 1, wherein the oscillation frequency varies with a supply voltage coupled to the synthetic inductance and the active admittance transformation network.

9. The oscillator of claim 1 wherein the synthetic inductance comprises:
a first amplifier configured to provide nearly unity gain, a high input impedance and a low output impedance, the first amplifier having a first output coupled to the port and a first input;
a first capacitor coupled between the port and a first reference voltage;
a second amplifier configured to provide greater than unity voltage gain, the second amplifier having a second input coupled to the first output and a second output coupled to the first input; and
a second capacitor coupled between the second output and a second reference voltage.

10. The oscillator of claim 9, wherein the first amplifier is a source follower amplifier and the second amplifier is a common source amplifier.

11. The oscillator of claim 9, wherein the first and second capacitors are thin-film capacitors.

12. The oscillator of claim 9, wherein the first and second capacitors are MOS capacitors.

13. A voltage controlled oscillator comprising:
synthetic inductor means for providing an admittance having an inductive characteristic including a Q of greater than twenty at an output; and
active admittance transformation network means coupled to the synthetic inductor means, the active admittance transformation means for transforming a real part of the output admittance from a positive value to a negative value to form a high frequency oscillator, the synthetic inductor means and the active admittance transformation network means being fabricated on a single integrated circuit, the active admittance transformation means comprising:
a constant current source coupled between a power supply node of the synthetic inductor means and a power supply;

a transistor having control electrode coupled to the power supply node, a first power electrode coupled to the power supply and a second power electrode coupled to the output; and a phase shifter coupled to a control electrode of the first transistor and to the power supply node.

14. The oscillator of claim 13 wherein the synthetic inductor means and the active admittance transformation network means consist essentially of resistors, capacitors, transistors and interconnections.

15. The oscillator of claim 13 wherein the synthetic inductor means and the active admittance transformation network means are formed by a CMOS process.

16. The oscillator of claim 13 wherein the synthetic inductor means and the active admittance transformation network means are formed by a BiCMOS process.

17. The oscillator of claim 13, wherein an oscillation frequency of the oscillator varies with a supply voltage that is coupled to the synthetic inductor means and the active admittance transformation means.

18. The oscillator of claim 13, wherein the transistor comprises an NMOS FET.

19. The oscillator of claim 13 wherein the synthetic inductor means comprises:

a port providing the output admittance coupled to the output;

a first amplifier configured to provide nearly unity gain, a high input impedance and a low output impedance, the first amplifier having a first input and a first output, the first output coupled to the port;

a first phase shifter coupled between the port and a reference voltage;

a second amplifier configured to provide greater than unity voltage gain, the second amplifier having a second input coupled to the first output and a second output coupled to the first input; and a second phase shifter coupled between the second output and a power supply voltage.

20. The oscillator of claim 19, wherein the first amplifier is a source follower amplifier and the second amplifier is a common source amplifier.

21. The oscillator of claim 19, wherein the first and second phase shifters include thin-film capacitors.

22. The oscillator of claim 19, wherein the first and second phase shifters include MOS capacitors.

23. A voltage controlled oscillator comprising:

an output;

a first transistor having a first control electrode and first and second power electrodes, the first power electrode coupled to the output and to a first constant current source, the second power electrode coupled to a power supply through a second constant current source;

a first phase shifter having a first electrode coupled to the first power electrode and a second electrode coupled to ground;

a second phase shifter having a first electrode coupled to the first control electrode and a second electrode coupled to ground;

a second transistor having a second control electrode coupled to the output, a first power electrode coupled to signal ground and a second power electrode coupled to the first control electrode of the first transistor and to a third constant current source;

a third transistor having a control electrode coupled to the second power electrode of the first transistor, a first power electrode coupled to the output and a second power electrode coupled to signal ground; and a third phase shifter having a first electrode coupled to signal ground and a second electrode coupled the control electrode of the third transistor.

24. The oscillator of claim 23 wherein the first, second and third transistors and the first, second and third phase shift networks are formed in a single integrated circuit using a CMOS process.

25. The oscillator of claim 23 wherein the first, second and third transistors and the first, second and third phase shift networks are formed in a single integrated circuit using a BiCMOS process.

26. The oscillator of claim 23, further comprising a resistive voltage divider including:

a first resistor having a first terminal coupled to a power supply and a second terminal coupled a first node that is coupled to the second and third current sources;

a second resistor having a first terminal coupled to the first node and a second terminal coupled to the first current source and to a second node; and a third resistor having a first terminal coupled to the second node and a second terminal coupled to ground.

27. The oscillator of claim 23, wherein the first and second transistors are n-channel FETs, the first transistor having a first channel width, the second transistor having a second channel width, the third transistor is a PMOS FET having a third channel width, the first current source is an NMOS FET having a gate coupled to the second node and a channel width equal to the sum of the first and third channel widths, the second current source is a PMOS FET having a gate coupled to the first node and a channel width equal to the first channel width and the third current source is a PMOS FET having a gate coupled to the first node and a channel width equal to the second channel width.

28. The oscillator of claim 23, wherein the first, second and third phase shifters include thin-film capacitors.

29. The oscillator of claim 23, wherein the first, second and third phase shifters include MOS capacitors.

30. The oscillator of claim 23, wherein an oscillation frequency of the oscillator varies with a voltage from the power supply.

31. The oscillator of claim 23, wherein an oscillation frequency of the oscillator is greater than fifty megahertz.

* * * * *